(12) United States Patent
Hanabe et al.

(10) Patent No.: US 6,432,330 B1
(45) Date of Patent: Aug. 13, 2002

(54) JET SYSTEM FOR SPHERICAL SHAPE DEVICES

(75) Inventors: Murali Hanabe, Dallas; Nainesh J. Patel, Plano, both of TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/683,775

(22) Filed: Feb. 13, 2002

Related U.S. Application Data
(60) Provisional application No. 60/279,484, filed on Mar. 28, 2001.

(51) Int. Cl.[7] .................................................. B29B 9/10
(52) U.S. Cl. ................................ 264/9; 264/13; 425/6; 75/335; 75/340
(58) Field of Search .............................. 264/5, 7, 9, 13; 425/6; 75/330, 335, 340

(56) References Cited

U.S. PATENT DOCUMENTS 1,951,790 A * 3/1934 Curran ........................ 264/13
4,986,941 A * 1/1991 Hendrix et al. ............... 264/13

* cited by examiner

*Primary Examiner*—Mary Lynn Theisen
(74) *Attorney, Agent, or Firm*—Haynes and Boone LLP

(57) ABSTRACT

A system and method for making very small (e.g., 1 millimeter diameter) spherical shaped devices is disclosed. The system includes a supply system for providing predetermined amounts of raw material into a chamber, which is used for melting the raw material. The melted raw material is then provided to a dropper for measuring predetermined amounts of the melted raw material (droplets) and releasing the droplets into a drop tube, where they are cooled and solidified into spherical shaped silicon devices. The system includes a container of silicon powder in which the solidified spherical shaped devices are received from the drop tube, the container including a stirring mechanism for agitating the silicon powder. The system also includes a separating device for separating the powder from the solidified spherical shaped devices after the devices have been received into the container.

20 Claims, 3 Drawing Sheets

JET SYSTEM FOR SPHERICAL SHAPE DEVICES

This disclosure claims the benefit of U.S. Ser. No. 60/279,484, filed Mar. 28, 2001.

BACKGROUND

The invention relates generally to semiconductor devices, and more particularly, to a system and method for creating three-dimensional semiconductor devices.

In U.S. Pat. No. 5,955,776, which is hereby incorporated by reference, a method and apparatus for manufacturing spherical-shaped semiconductor integrated circuit devices is disclosed. Although certain systems and methods for performing various processing operations are discussed in the above-referenced patent, it is desired to further improve on the operations. For example, in making a p-n junction diode, a first type (e.g. n-type) outer layer is diffused onto a second type (e.g., p-type) spherical shaped semiconductor substrate. It is desired that both the outer layer and the inner substrate are maintained at an appropriate shape, thickness, and diffusion concentration.

In U.S. patent Ser. No. 09/490,650, now U.S. Pat. No. 6,365,493, and Ser. No. 09/489,782, now U.S. Pat. No. 6,331,477 which are hereby incorporated by reference, methods for doping material on a spherical shaped substrate in a non-contact environment are disclosed. These methods can be used to make spherical p-n junction diodes for solar cell applications. It is desired, however, to make uniform sized spherical p-n diodes in a continuous operation (e.g., a single step).

In U.S. patent Ser. No. 09/363,420, now U.S. Pat. No. 6,264,742, and Ser. No. 09/672,566, now U.S. Pat. No. 6,383,287, which are hereby incorporated by reference, methods for making single crystal devices and for making uniformly thick p-n junctions on these devices are disclosed, respectively. It is desired, however, to better automate the production of these devices in a highly manufacturable setting.

SUMMARY

A technical advance is achieved by a new and improved jet system for making spherical shaped devices. In one embodiment, the system includes a supply system for providing predetermined amounts of raw material at a temperature at or above a melting point of the material, and for moving the predetermined amounts of melted raw material without physical contact so that a liquid surface tension of each predetermined amount of melted raw material will cause the material to form into a spherical shape device. The system also includes a container of powder in which the solidified spherical shaped devices are received from the supply system and means for separating the powder from the solidified spherical shaped devices after the devices have been received.

In another embodiment, the system includes a supply system for providing predetermined amounts of raw material into a chamber, which is used for melting the raw material. The melted raw material is then provided to a dropper for measuring predetermined amounts of the melted raw material (droplets) and releasing the droplets into a drop tube, where they are cooled and solidified into spherical shaped silicon devices. The system includes a container of silicon powder in which the solidified spherical shaped devices are received from the drop tube, the container including a stirring mechanism for agitating the silicon powder. The system also includes a separating device for separating the powder from the solidified spherical shaped devices after the devices have been received into the container.

DETAILED DESCRIPTION

The present disclosure provides many different embodiments, or examples, for implementing different features of the invention. Specific examples of components, sizes, and arrangements are described below to simplify the present disclosure and are not intended to limit the invention.

Figure 1:
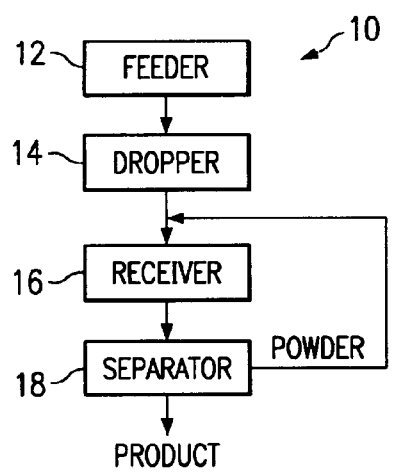
FIG. 1 is a flow chart of a new and improved processing flow for creating spherical shaped devices according to one embodiment of the present invention.

Referring to FIG. 1, the reference numeral 10 designates, in general, one embodiment of a processing flow for making spherical shaped semiconductor devices. The processing flow 10 utilizes a feeder system 12 that provides continuous feeding of raw material and prevents undesired material and/or fluids from entering other components. The feeder system 12 provides the material to a dropper 14, which is used to make the spherical shaped semiconductor devices. The spherical shaped semiconductor devices are received into a receiver 16, which include a soft powderlike refractory receiving material, such as quartz. The devices and receiving material are then provided to a separator 18 where the receiving material is separated and recycled.

The following discussion provides many different embodiments for different systems that can be used in the processing flow 10. Each of the embodiments are different, but may include similar components that are similarly numbered.

Figure 2:
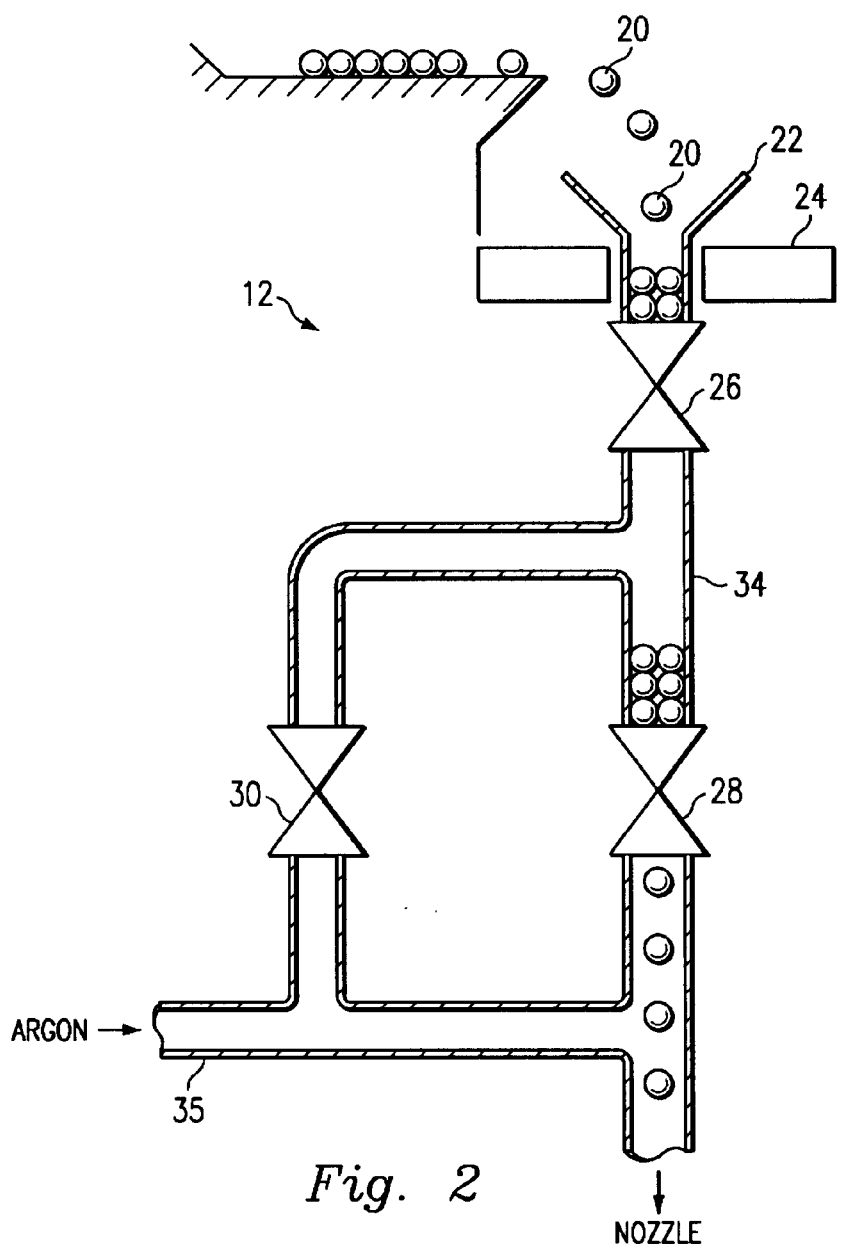
FIG. 2 is a diagram of a feeder device, such as can be used in the processing flow of FIG. 1.

Referring now to FIG. 2, in one embodiment of the feeder system 12, raw material Si 20 is received in the form of chunks, powder or granules into a receiver 22. The receiver 22 includes a sensor 24 for detecting the raw material and ensuring a continuous feeding of raw material into the feeder. The flow of the raw material 20 is controlled by two valves 26, 28. In addition, an argon gas is controlled by valves 28 and 30.

The feeder 12 is designed to ensure continuous feeding of the raw material 20 into the dropper system 14, while at the system eliminating ingress of atmosphere into a nozzle (FIG. 3) of the dropper. When the first valve 26 is opened, the raw material 20 will drop into a first tube portion 34. Thereafter, the first valve 26 is closed and the third valve 30 is opened to introduce Argon through a first pipe 35. When the second valve 28 is opened the feed will be dropped into the nozzle. The second valve 28 and the third valve 30 are thereafter closed. In one embodiment, the dropper 14 is as disclosed in presently incorporated U.S. patent Ser. No. 09/672,566.

Figure 3:
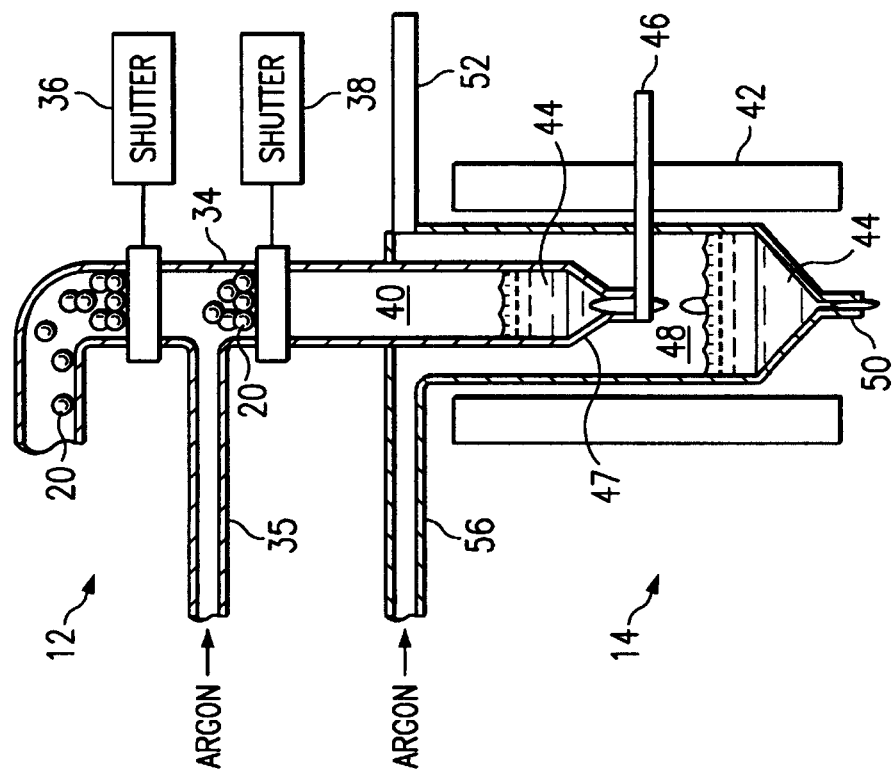
FIGS. 3–4 are diagrams of a dropper device, such as can be used in the processing flow of FIG. 1.
Figure 4:
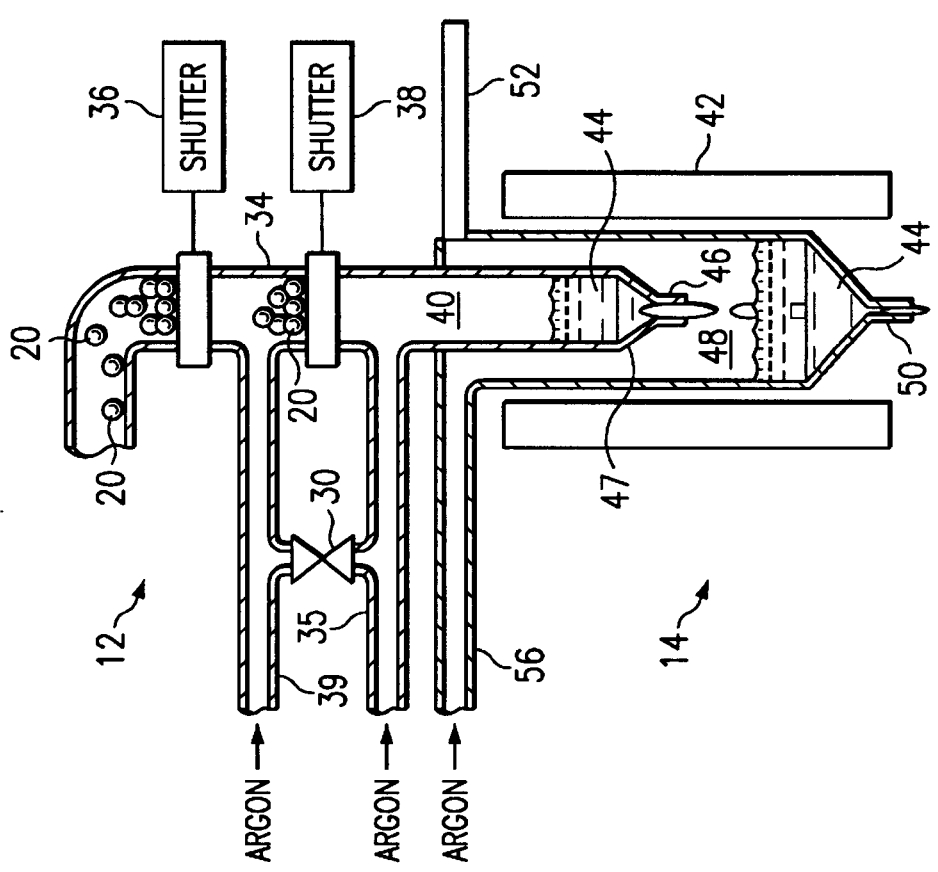

Referring now to FIGS. 3 and 4, in other embodiments of the feeder system 12, the flow of the raw material 20 is controlled by two shutters 36, 38. In the embodiment of FIG. 3, a second Argon pipe 39 is also used to introduce Argon to the operation.

The feeder system 12 provides the raw material 20 to the receiver system 14, where it proceeds to a chamber 40. The raw material is melted by a furnace 42 into a liquid state (designated as liquid material 44), which in the case of pure silicon is near 1400° C. In some embodiments, such as is shown in FIG. 4, the chamber 40 is attached to a first vibration device 46, such as a piezo-electric vibrator (PZT). The first PZT 46 encourages the liquid material 44 to move through a first nozzle 47 at a predetermined rate into a second chamber 48. In addition, a gas (e.g., Argon) may be supplied through a first pipe 35 to apply a pressure to the first chamber 40 and further help control the flow of the liquid material into the second chamber 48.

The second chamber 48 receives the liquid material 44 from the first chamber 40 and feeds it into a jet nozzle 50, that is controlled by a second vibration device 52. The nozzle 50 and second vibration device 52 can thereby produce liquid droplets 54 of a predetermined size, e.g. about one millimeter. In addition, a gas (e.g., Argon) may be supplied through a second pipe 56 to apply a pressure to the second chamber 48 and further help control the creation of the liquid droplets 54.

Figure 5:
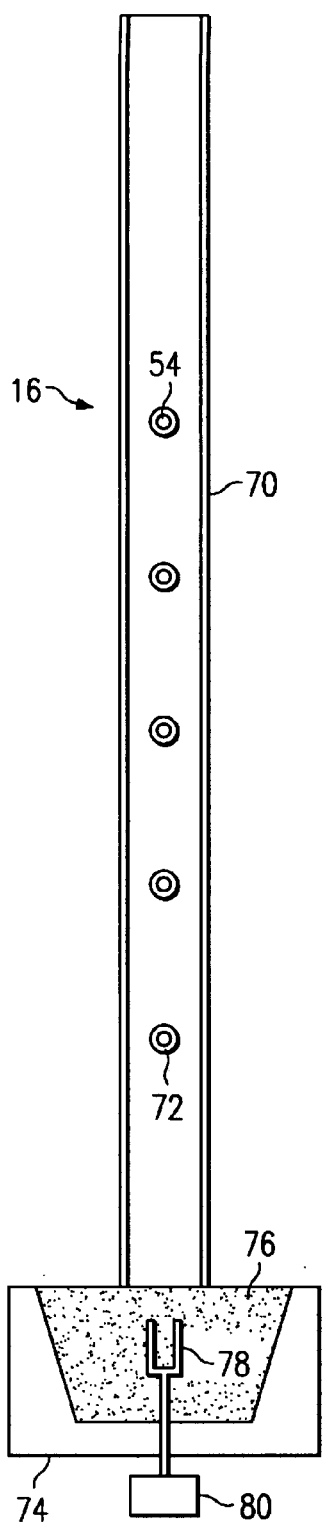
FIG. 5 is a diagram of a receiver device, such as can be used in the processing flow of FIG. 1.

Referring now to FIG. 5, in one embodiment of the receiver 16, the liquid droplets 54 can fall, without contact, through a drop tube 70. The rate at which the droplets move can be controlled, such as through a pressure or a moving fluid through the drop tube 70. Eventually, the droplets solidify into spheres 72. The temperature of the spheres 72 is relatively high, such as between 1000°–1300° C. (near the melting point of silicon).

The solidified spheres 72 are then received into a container 74. In the present embodiment, the container 74 is a furnace. The furnace 74 includes a powdered refractory material (e.g., quartz powder, silica, or ceramic powder) 76, which is heated to about 1000°–1300° C. The powder 76 is continually stirred by a quartz mixing rod 78 connected to a motor 80. The stirring exposes fresh powder 76 to the falling spheres 72. The powder 76 thereby provides a soft landing for the spheres 72.

Referring again to FIG. 1, the separator 18 receives the spheres 72 and powder 76 from the furnace. It is understood that there may be one or more separators 18 to repeatedly separate the powder 76 from the spheres 72. The spheres 72 can be provided to other downstream processing operations and the powder 76 can be returned to the receiver 16.

Figure 6:
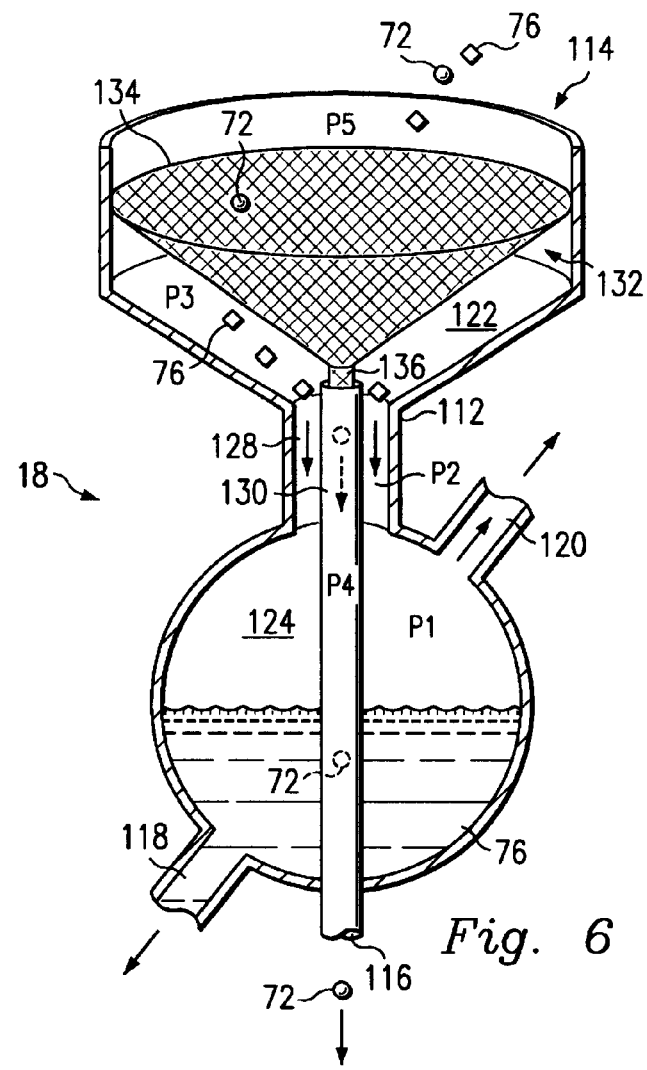
FIGS. 6–7 are diagrams of a separator device, such as can be used in the processing flow of FIG. 1.

Referring now to FIG. 6, in one embodiment the separator 18 includes an enclosure 112 having an inlet opening 114 and three outlet openings 116, 118, 120. The outlet opening 116 is located diametrically opposite the inlet opening 114. The enclosure 112 defines two chambers 122, 124. The chamber 122 is a separation chamber for receiving a supply of spheres 72 and powder 76 and the chamber 124 is a reservoir for receiving, storing and expelling the separated powder 76 through the outlet 118. The chamber 122 and reservoir 124 are connected by a neck portion 128.

A vertically extending conduit 130 is coaxially aligned with the chamber 122, the reservoir 124 and the neck 126. The conduit 130 supplies a path between the outlet 116 and a separating device 132 located in the separation chamber 122. For the present embodiment, the separating device 132 is a wire mesh formed into a funnel shape. The wire mesh 132 includes a plurality of openings having a diameter less than one-half the diameter of the sphere 72. The wire mesh 132 includes an opening 134 that registers with the inlet opening 114 to receive the supply of spheres 72 and powder 76. The wire mesh 132 also includes an outlet 136 that registers with the conduit 130.

Although not shown, a vacuum source is connected to the outlet 120 for providing a negative pressure inside the reservoir 124, the neck 128, and the separation chamber 122. The negative pressure is not strong enough to lift either the spheres 72 or the powder 76.

For the sake of reference, the pressure at several locations inside the fluid separating processor 18 are identified. A pressure P1 represents the pressure inside the reservoir 124; a pressure P2 represents the pressure inside the neck 128; a pressure P3 represents the pressure inside the separation chamber 122; a pressure P4 represents the pressure at the conduit 130; and a pressure P5 represents the pressure at the opening 114. The following comparative relationships exist between the different pressures P:

$$P1 < P2 \tag{1}$$

$$P2 < P3 \text{ and } P5 \tag{2}$$

$$P4 > P3 \text{ and } P5 \tag{3}$$

In operation, the supply of spheres 72 and powder 76 are introduced into the opening 114. The spheres 72 are preferably of a generally spherical shape and could be of the same type formed according to the technique disclosed in the above-identified and presently incorporated patent application Ser. No. 08/858,004. The powder 76 may be a flow of constituents or liquids or the like. For the sake of example, the powder 76 is a high-viscosity liquid from a previous process.

When the spheres 72 and powder 76 enter the separation chamber 122, they contact the wire mesh 134 and are propelled towards the opening 136. In the preferred embodiment, the pressure P3 assists this propelling action, but in other embodiments, the momentum of the spheres 72 and powder 76, or other forces, may so assist.

As the powder 76 is propelled towards the opening 136, it flows through the wire mesh 134. The pressure P3 helps to draw the powder 76 through the wire mesh 134. In some embodiments, the (higher) pressure P4 from the conduit 130 also persuades the powder 76 to move through the wire mesh 134. In so doing, even highly viscous fluid will be drawn through the wire mesh, despite the wire mesh's narrow openings. The fluid is then drawn by either gravity or by the pressure P2, or both, into the neck 128 and further drawn (by gravity and/or the pressure P1) into the reservoir 124. It is noted that the reservoir 124 is physically isolated from the interior of the conduit 130 so that none of the powder 76 can enter the conduit. The reservoir 124 maintains a portion of the powder 76 while draining out another portion through the outlet 118.

As the spheres 72 move toward the opening 136, they cannot move through the wire mesh 134. Instead, the spheres 72 move into the conduit 130 and then exit through the outlet 116.

Figure 7:
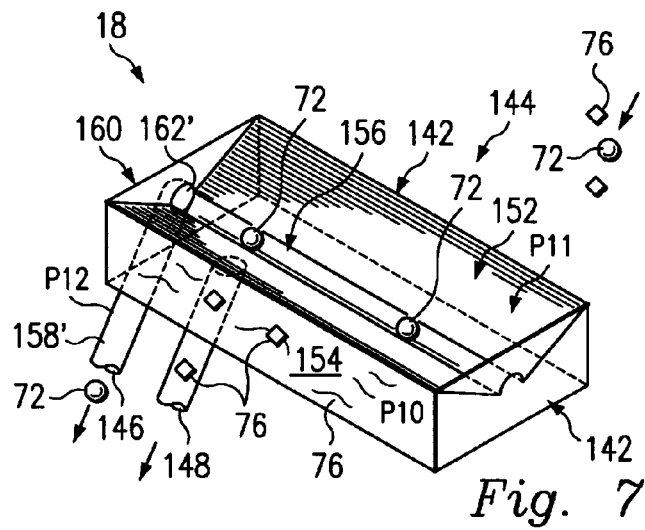

Referring to FIG. 7, in another embodiment, the separator 18 includes an enclosure 142 having an inlet opening 144 and two outlet openings 146, 148. The outlet opening 146 is opposite the inlet opening 144. The enclosure 142 defines a chamber 152 and a reservoir 154. The chamber 152 is a separation chamber for receiving a supply of spheres 72 and powder 76 and the reservoir 154 receives and stores and expels the separated powder 76 using the outlet 148. The chamber 152 and reservoir 154 are connected by a slot 156.

A vertically extending conduit 158 is connected at one end 160 of the chamber 152 and passes through the reservoir 154. The conduit 158 supplies a path between the outlet 146 and an opening 162 at the end 160 of the slot 156. For the present embodiment, the slot 156 acts as a separation device by providing an opening with a diameter less than the diameter of the sphere 72 (except at the opening 162) but sufficiently large to allow the powder 76 to flow there through.

Although not shown, a vacuum source is connected to the outlet 148 for providing a negative pressure inside the reservoir 154, the slot 156, and the separation chamber 152. Also not shown, a plurality of air inlets may be provided in the chamber 152. The air inlets may be used to provide a dry, inert gas such as N2 to the chamber.

For the sake of reference, the pressure at several locations inside the fluid separating processor 18 are identified. A pressure P10 represents the pressure inside the reservoir 154; a pressure P11 represents the pressure the separation chamber 152; and a pressure P12 represents the pressure at the conduit 158. The following comparative relationships exist between the different pressures P:

$$P10 < P11 \text{ and } P12 \qquad (4)$$

In operation, the supply of spheres 72 and powder 76 are introduced into the opening 144, opposite to the end 160. When the spheres 72 and powder 76 enter the separation chamber 152, they contact the slot 156 and are propelled towards the opening 162 at the end 160.

The slot 156 is small enough so that a sphere 72 cannot fall into the reservoir 154, but the powder 76 can. The pressure P10 and the dry inert air help to draw the powder 76 through the slot 156. In some embodiments, the pressure P12 from the conduit 130 may be high to prevent any of the powder 76 from entering the conduit.

It is noted that the reservoir 154 is physically isolated from the interior of the conduit 158 so that none of the powder 76 can enter the conduit. The reservoir 154 drains the powder 76 through the outlet 148.

It is understood that several variations may be made in the foregoing. For example, different heating steps may be used in different parts of the system 10. Other modifications, changes and substitutions are also intended in the foregoing disclosure and in some instances some features of the invention will be employed without a corresponding use of other features. Accordingly, it is appropriate that the invention be construed broadly.

What is claimed is:

1. A system for making spherical shaped devices, comprising:
    a supply system for providing predetermined amounts of raw material at a temperature at or above a melting point of the material, and for moving the predetermined amounts of melted raw material without physical contact so that a liquid surface tension of each predetermined amount of melted raw material will cause the material to solidify into a spherical shape device;
    a container of powder in which the solidified spherical shaped devices are received from the supply system; and
    means for separating the powder from the solidified spherical shaped devices after the devices have been received.

2. The system of claim 1 wherein the supply system includes:
    a first chamber for containing the raw material in a liquid state; and
    a first dropper registering with the first chamber for forming the predetermined amounts of melted raw material.

3. The system of claim 2 wherein the supply system further includes:
    an inlet for receiving a gas to facilitate the formation of the predetermined amounts of melted raw material by the first dropper.

4. The system of claim 2 wherein the supply system further includes:
    a vibrator connected to the first dropper to facilitate the formation of the predetermined amounts of melted raw material by the first dropper.

5. The system of claim 2 wherein the supply system includes:
    a second chamber for containing the raw material in a liquid state; and
    a second dropper registering with the first chamber for providing the melted raw material to the first chamber and maintaining a relatively constant supply of the melted raw material in the first chamber.

6. The system of claim 1 wherein the container includes:
    means for agitating the powder in which the solidified spherical shaped devices are received and moving the powder and devices towards the separation means.

7. The system of claim 1 wherein the separator includes:
    an enclosure including an input for receiving the receiver material and the devices, a first outlet for outputting the devices and a second outlet for outputting the receiver material;
    first and second chambers defined within the enclosure, the first chamber registering with the input and the first outlet and the second chamber registering with the second outlet;
    a separator device positioned between the first and second chambers, the separator device having at least one opening having a size that is less than a size of the device but greater than a size of the receiver material; and
    means for providing a negative pressure to the second chamber to encourage the receiver material to flow from the first chamber, through the at least one opening, and into the second chamber.

8. The system of claim 1 wherein the separator includes a wire mesh.

9. The system of claim 8 wherein the wire mesh includes a plurality of openings with a size less than one half the size of the device but greater than the size of the receiver material.

10. The system of claim 7 wherein the separator further includes:
    a third outlet for registering the pressure means with the second chamber.

11. The system of claim 7 wherein the first outlet has a positive pressure, as compared to the negative pressure of the second chamber.

12. The system of claim 7 wherein the second chamber facilitates returning the separated receiver material back to the container.

13. A method for making spherical shaped semiconductor devices from molten raw material, the method comprising:
    dropping predetermined amounts of the molten raw silicon material into a drop tube;
    solidifying the predetermined amounts inside the drop tube so that a liquid surface tension of each predetermined amount will cause the material to form a spherical shape device; and
    receiving the solidified spherical devices into a container of silicon powder.

14. The method of claim 13 further comprising:
separating the powder from the solidified spherical shaped devices after the devices have been received.

15. The method of claim 13 further comprising:
forming the predetermined amounts of melted raw material using a pressurized gas and a dropper.

16. The method of claim 13 further comprising:
forming the predetermined amounts using a vibrator connected to a dropper.

17. The method of claim 13 further comprising:
agitating the powder in which the solidified spherical shaped devices are received.

18. The method of claim 13 further comprising:
stirring the powder in which the solidified spherical shaped devices are received.

19. A system for making spherical shaped silicon devices, comprising:

a supply system for providing predetermined amounts of raw material into a chamber;

the chamber for melting the raw material;

a dropper for measuring predetermined amounts of melted raw material (droplets) and releasing the droplets into a drop tube;

the drop tube for receiving the droplets and cooling the droplets into solidified spherical shaped silicon devices;

a container of silicon powder in which the solidified spherical shaped devices are received from the drop tube, the container including a stirring mechanism for agitating the silicon powder; and a separating device for separating the powder from the solidified spherical shaped devices after the devices have been received into the container.

20. The system of claim 19 wherein the stirring mechanism of the container also services to move the received spherical shaped devices and a portion of the silicon powder towards the separating device.

* * * * *